(12) United States Patent
Chandhok

(10) Patent No.: US 6,972,843 B2
(45) Date of Patent: Dec. 6, 2005

(54) LITHOGRAPHY ALIGNMENT

(75) Inventor: Manish Chandhok, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/648,627

(22) Filed: Aug. 25, 2003

(65) Prior Publication Data
US 2005/0046846 A1 Mar. 3, 2005

(51) Int. Cl.[7] .............................................. G01B 11/00
(52) U.S. Cl. ....................................................... 356/401
(58) Field of Search ................................ 356/399–401; 250/548; 430/5, 22, 30; 355/53, 55

(56) References Cited

U.S. PATENT DOCUMENTS

| 4,828,392 | A | * | 5/1989 | Nomura et al. | ............. | 356/401 |
| 6,118,516 | A | * | 9/2000 | Irie et al. | .................... | 355/53 |
| 6,481,003 | B1 | | 11/2002 | Maeda | | |
| 6,567,155 | B1 | | 5/2003 | Chandhok et al. | | |

OTHER PUBLICATIONS

John E. Bjorkholm, "EUV Lithography—The Successor to Optical Lithography?", Intel Technology Journal Q3'98 (John.Bjorkholm@intel.com).

* cited by examiner

Primary Examiner—Layla Lauchman
Assistant Examiner—Gordon J. Stock, Jr.
(74) Attorney, Agent, or Firm—Fish & Richardson P.C.

(57) ABSTRACT

A wafer may be aligned with an imaging plate including an alignment grating with a pitch P. A pupil filter in the pupil plane of the optical system may be used so that the periodicity of the intensity of light from the alignment grating is less than P at the wafer plane. Thus, an alignment pattern on the wafer having a pitch smaller than the pitch of the alignment grating may be used. For example, the intensity periodicity at the wafer plane may be P/2. In an implementation, a pupil filter may be sized and positioned to block a zero-th order maximum of light transmitted through the alignment grating at the pupil plane. The pupil filter may be sized and positioned to allow first order maxima of the light to pass. The alignment system may be used with transmission or reflection optics.

20 Claims, 5 Drawing Sheets

LITHOGRAPHY ALIGNMENT

BACKGROUND

Semiconductor devices are fabricated using a succession of spatially related patterns that are transferred to a substrate using lithography. In order to ensure that the devices perform as expected, successive patterns need to be aligned to within a particular alignment tolerance.

In order to align the wafer with the mask or reticle, some lithography systems use through the lens (TTL) alignment techniques. FIG. 1 shows a schematic of a lithography system 100 using TTL alignment. A reticle 110 includes an alignment grating 120 with a pitch P. A wafer 150 to be aligned with reticle 110 includes a previously fabricated alignment pattern 140, also with pitch P. Alignment pattern 140 is generally positioned below a top surface of wafer 150. Note that system 100 may include additional optical elements between reticle 110 and wafer 150, such as one or more lenses.

Grating 120 is illuminated using a light source 130. Light transmitted through grating 120 is incident on wafer 150. The incident light at wafer 150 has the same periodicity as that of grating 120. That is, the distance between intensity maxima of the incident light is equal to the pitch P of grating 120.

At least some of the light is reflected by wafer 150. For example, portions of the incident light which are incident on the features of alignment pattern 140 are strongly reflected, while portions of the incident light which are incident on areas between the features of alignment pattern 140 are less strongly reflected (i.e., a higher proportion of the incident light is absorbed in the areas between the features of alignment pattern 140). Light reflected from wafer 150 is then detected; for example, a portion of the light reflected from the surface of wafer 150 is directed to a detector 170 using a partial mirror 160.

To determine the optimum alignment, the position of wafer 150 is changed using a wafer stage 155. When grating 120 and pattern 140 are aligned, the signal detected with detector 170 is maximum. The signal received by detector 170 may be indicative of a reflected light intensity and/or a interference pattern of the reflected light.

To detect an interference pattern, mirror 160 may be a beam splitter, as shown in FIG. 1. Light 132 is incident on mirror 160. A reference portion 133 is reflected toward detector 170. A transmitted portion 134 continues toward wafer 150 and is at least partially reflected by alignment pattern 140. Mirror 160 reflects a signal portion 135 of the light reflected by alignment pattern 140 to detector 170. At detector 170, reference portion 133 and signal portion 135 produce an interference pattern, which varies as the position of wafer 150 is varied with respect to reticle 110. When grating 120 and alignment pattern 140 are aligned, the interference pattern exhibits constructive interference.

The resolution of the alignment system depends on a number of factors, such as the numerical aperture of the optical system, the wavelength of light used, and the pitch of the grating and alignment features. However, constraints on these parameters may affect the obtainable resolution.

For example, constraints on the wavelength of light used for alignment may place limits on the resolution of the system. Long wavelengths are typically used for two reasons: first, so that the light used to align the lithography system does not expose the photoresist, and second, so that the light is not overly absorbed in the material forming the alignment features on the wafer. Typical alignment wavelengths include 533 nm and 632 nm.

Choosing a particular alignment wavelength places constraints on the pitch of the alignment grating that may be used. For an optical system with a numerical aperture NA, a particular alignment wavelength $\lambda$ corresponds to a minimum alignment grating pitch of $P=\lambda/NA$. Smaller pitches are below the resolution limit, and thus the pattern fidelity is degraded.

DESCRIPTION OF DRAWINGS

Like reference symbols in the various drawings indicate like elements.

DETAILED DESCRIPTION

Systems and techniques described herein may be used for improved alignment of a lithography system.

Figure 1:
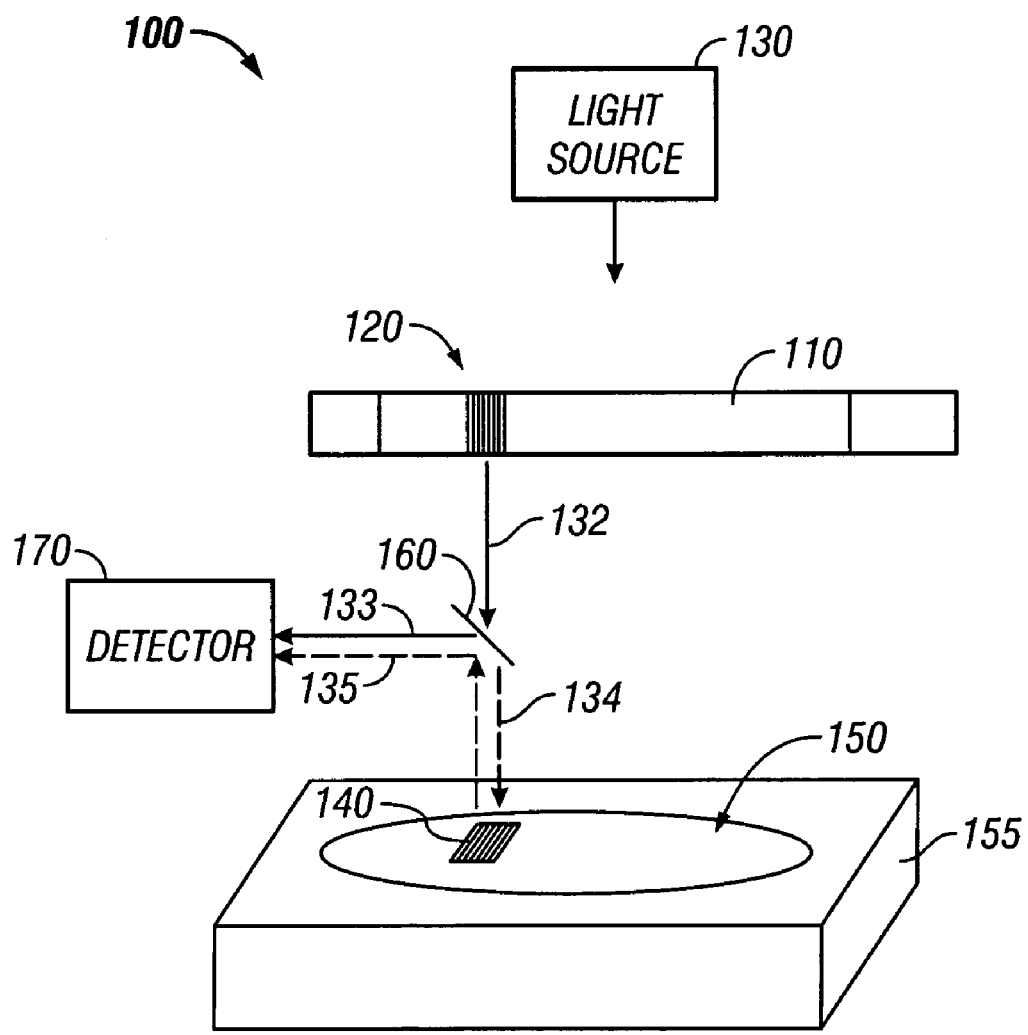
FIG. 1 shows a cross sectional view of an alignment system according to the prior art.
Figure 2A:
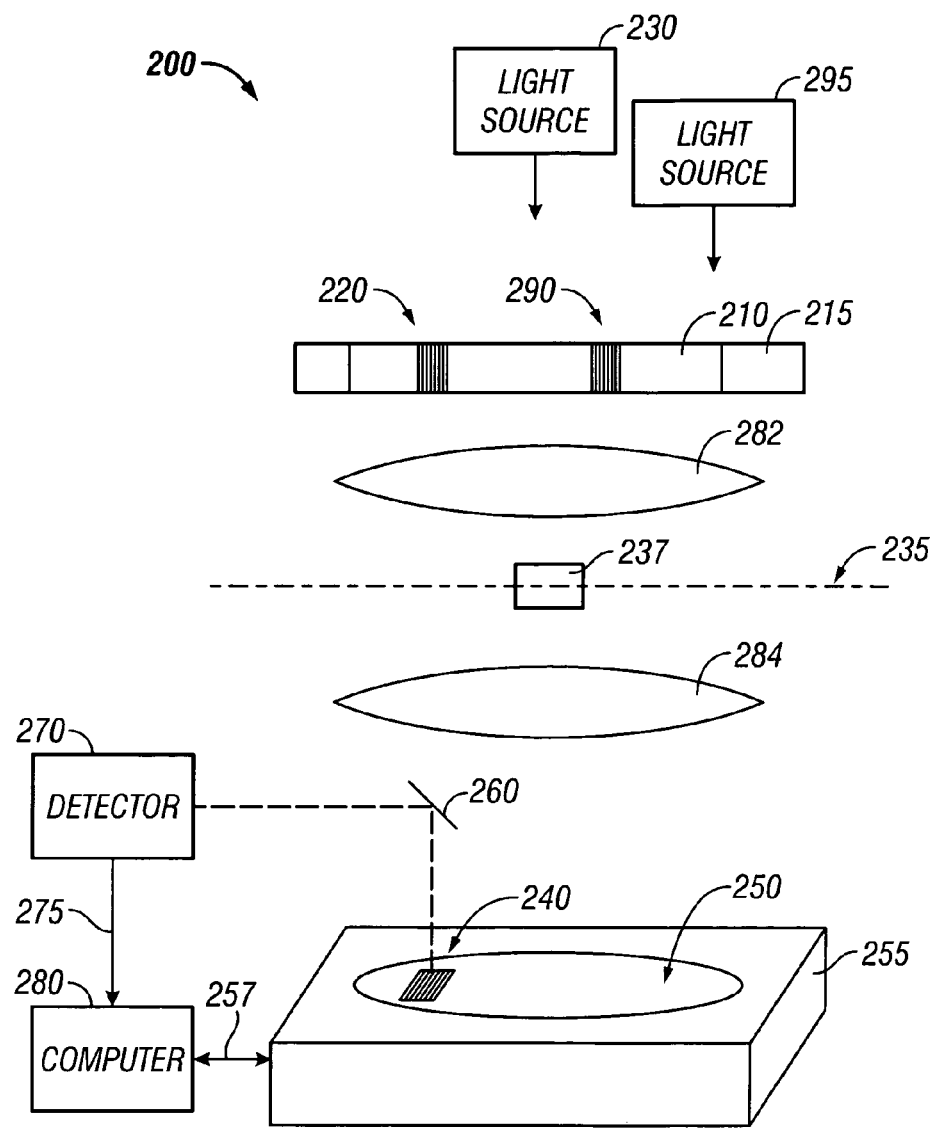
FIG. 2A shows a cross sectional view of an alignment system, according to an embodiment.

FIG. 2A shows an implementation of an alignment system 200 using transmission optics. An imaging plate such as a reticle 210 includes a grating 220 with a pitch P. Reticle 210 is positioned in a reticle holder 215. As noted above, for a particular wavelength $\lambda$ and numerical aperture (NA), the minimum pitch of grating 220 that may be used without compromising pattern fidelity is $P=\lambda/NA$.

Figure 2B:
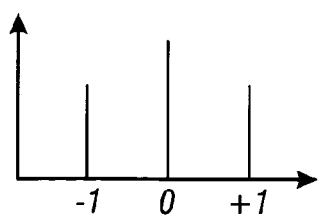
FIG. 2B shows the relative intensity and placement of the diffraction maxima just before the light is incident on the pupil plane.

A light source 230 illuminates grating 220; for example, with on-axis coherent light. At the pupil plane 235, the resulting image is the two-dimensional Fourier transform of grating 220. This image exhibits a zero-th order maximum, as well as first order maxima on either side of the zero-th order maximum. FIG. 2B shows the relative intensity and placement of the diffraction maxima just before the light is incident on the pupil plane.

Figure 2C:
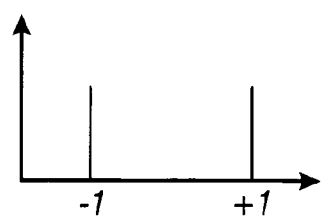
FIG. 2C shows the relative intensity and placement of the diffraction maxima just beyond the pupil plane.

A pupil filter 237, such as a central obscuration, is positioned at pupil plane 235. For a central obscuration, the pupil filter is shaped and sized to block the zero-th order maximum but to allow the first order maxima to pass. Note that other implementations of pupil filters may be used. For example, pupil filters that partially block light and/or change the phase may be used. FIG. 2C shows the relative intensity and placement of the diffraction maxima just beyond the pupil plane.

At the wafer plane, the image is the inverse Fourier transform of the image at pupil plane 235. Because the zero-th order maximum was removed from the image at the pupil plane, the inverse Fourier transform no longer exhibits the same periodicity as grating 220. Instead, the periodicity of the intensity at the wafer is half that of grating 220; that is, the light intensity has a periodicity of a grating with a pitch equal to P/2 rather than P. Thus, alignment pattern 240 may have a pitch of less than that of grating 220 (e.g., P/2), resulting in increased resolution for an alignment system for a given wavelength and numerical aperture.

In order to determine the optimum alignment of reticle 210 with wafer 250, a wafer stage 255 moves wafer 250 while the reflected light is detected in a detector 270. The light may be directed to detector 270 using one or more optical elements such as a mirror 260.

An output 275 of detector 270 may be provided to a data processor such as a computer 280. In some implementations, the data processor may be integrated with detector 270. Output 275 may be related to a characteristic of the reflected light incident on detector 270. For example, output 275 may be related to an intensity of the reflected light, or may be related to an interference pattern of the reflected light.

An output 257 of wafer stage 255 may also be provided to computer 280. Thus, computer 280 may correlate a characteristic of the reflected light with a position of wafer 250 to determine an alignment position; that is, a position at which the alignment pattern 240 is aligned with alignment grating 220 of reticle 210. For example, when the characteristic is an intensity of the reflected signal, the alignment position is the position at which the intensity of the reflected signal is a maximum, indicating that an edge of the alignment pattern 240 is aligned with a corresponding edge of alignment grating 220.

For an implementation in which the characteristic is an interference pattern, a number of different techniques may be used to produce the interference pattern. Mirror 260 (or another element of system 200) may be a beam splitter, which directs a portion of the incoming light beam toward detector 270 as a reference signal. Alternately, a computer-generated reference may be used. That is, output 275 may be a digitized signal corresponding to the light received in detector 270 (where the signal may be digitized in detector 270, in computer 280, or otherwise). Computer 280 may generate a reference signal, and may digitally mix the generated reference signal with digitized output 275 to produce an interference pattern.

System 200 may include additional elements. For example, system 200 may include a first lens 282 between reticle 210 and pupil filter 237. System 200 may also include a second lens 284 between pupil filter 237 and wafer 250.

The pitch of alignment grating 220 may be $\lambda$/NA or greater. Therefore, the pitch of alignment pattern 240 may be $\lambda$/2NA or greater, with the pitch of alignment pattern 240 chosen to be about half that of the pitch of alignment grating 220. For example, the pitch of alignment pattern 240 may be between about $\lambda$/2NA and about 9$\lambda$/10NA.

In some implementations, pupil filter 237 may be removable. For example, in a system 200 using visible light (and transmission optics) to pattern devices on wafer 250, pupil filter 237 may be used to modify the periodicity of the light intensity at the wafer to be P/2 for alignment, then removed prior to patterning devices.

Subsequent to aligning reticle 210 and wafer 250 using alignment grating 220 and alignment pattern 240 and (optionally) removing pupil filter 237, a device pattern 290 on reticle 210 may be transferred to wafer 250 as follows. Light from light source 230 or a different light source 295 may by transmitted to a surface of wafer 250 (for example, via first lens 282 and second lens 284), where the wavelength of the light is chosen to expose a resist layer on a top surface of wafer 250. Device pattern 290 is thus transferred to wafer 250.

Figure 3:
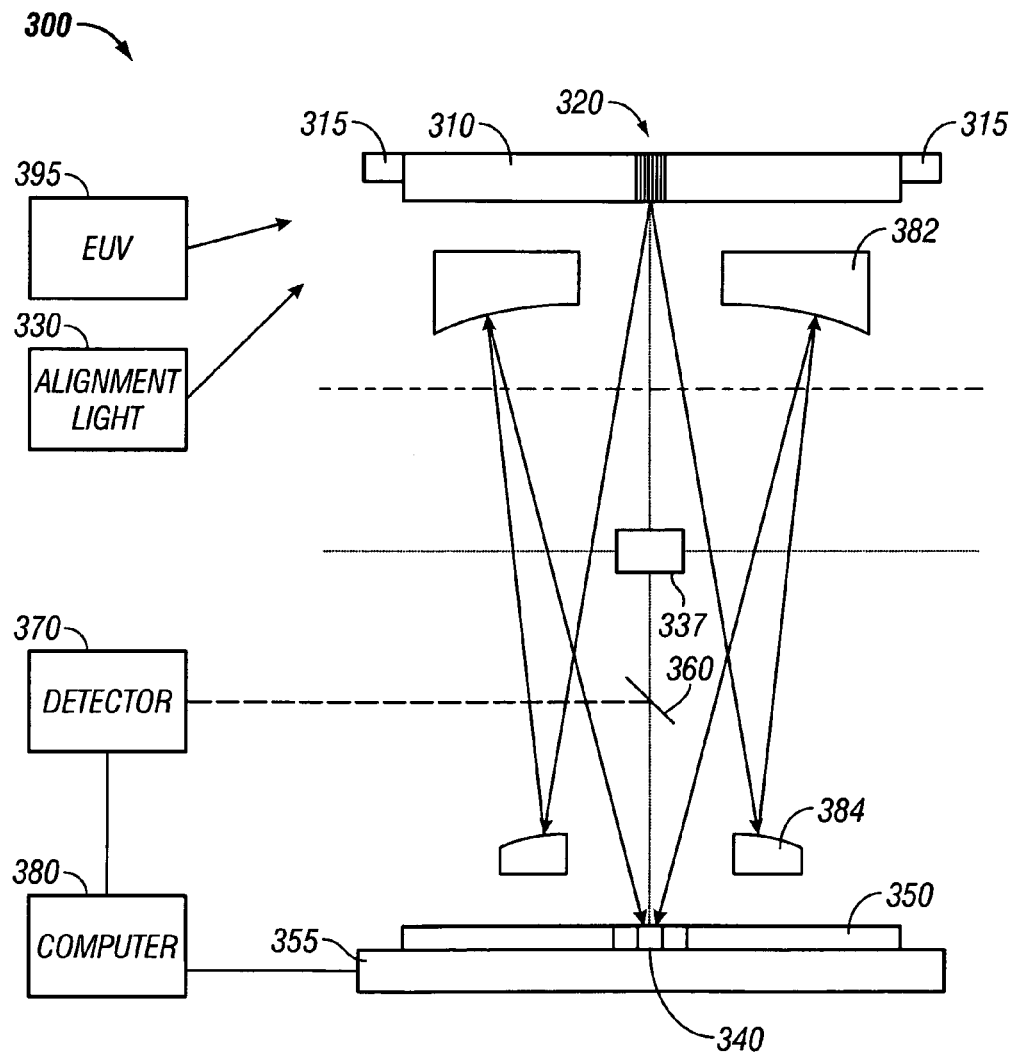
FIG. 3 shows a cross sectional view of an alignment system using reflection optics.

Other implementations of alignment systems may be used. For example, FIG. 3 shows an alignment system 300 using reflection optics rather than transmission optics for patterning devices on a wafer. Such a system may be used, for example, in a lithography system employing ultraviolet (UV) light such as extreme UV (EUV) light. Reflection optics are generally used in EUV lithography because EUV is readily absorbed in many materials.

For a reflection optics system, a pupil filter such as filter 337 may be used during lithographic patterning of device features using a Schwarzschild optics system such as that illustrated in FIG. 3. The current inventors recognized that pupil filter 337 may also be used with an alignment system to provide frequency doubling for improved alignment using longer wavelength light (e.g., 533 nm or 632 nm light).

For example, system 300 may be used as follows. A wafer 350 may be mounted in a wafer stage 355. A mask 310 including an alignment grating 320 with a pitch P may be positioned in a mask holder 315. An alignment light source 330 may be positioned to provide light for an alignment process. Note that alignment grating 320 may be a transmission grating (i.e., alignment light may be transmitted through the grating), or a reflection grating as illustrated (i.e., alignment light is reflected from the grating toward a wafer plane).

In an implementation, pupil filter 337 is a central obscuration. Pupil filter 337 is positioned in the pupil plane and sized to block a zero-th order maximum of the light from grating 320, and to allow first order maxima to pass. A portion of the light incident on an alignment pattern 340 with a pitch of P/2 is reflected and directed toward a detector 370 using (e.g.) a mirror 360.

Wafer stage 355 moves wafer 350 while reflected light is detected in detector 370. An output of detector 370 may be provided to a data processor such as a computer 380 (or the data processor may be integrated with the detector). The output may be related to a characteristic of the reflected light incident on detector 370, such as an intensity or an interference pattern.

In a reflective optics system such as that shown in FIG. 3, it may be more difficult to produce a physical reference signal to produce an interference pattern with light reflected from pattern 340. Therefore, a reference may be generated using computer 380, then mixed digitally with a digitized output of detector 337 (e.g., the signal may be digitized by detector 337, by computer 380, or otherwise).

Wafer stage 355 may also provide an output to computer 380. Computer 380 may correlate a characteristic of the reflected light with a position of wafer 350 to determine an alignment position at which alignment grating 320 is aligned with pattern 340.

System 300 may include other elements. For example, system 300 may include a primary mirror 384 and a secondary mirror 382 for patterning device features on wafer 350 using EUV light from source 395.

Figure 4:
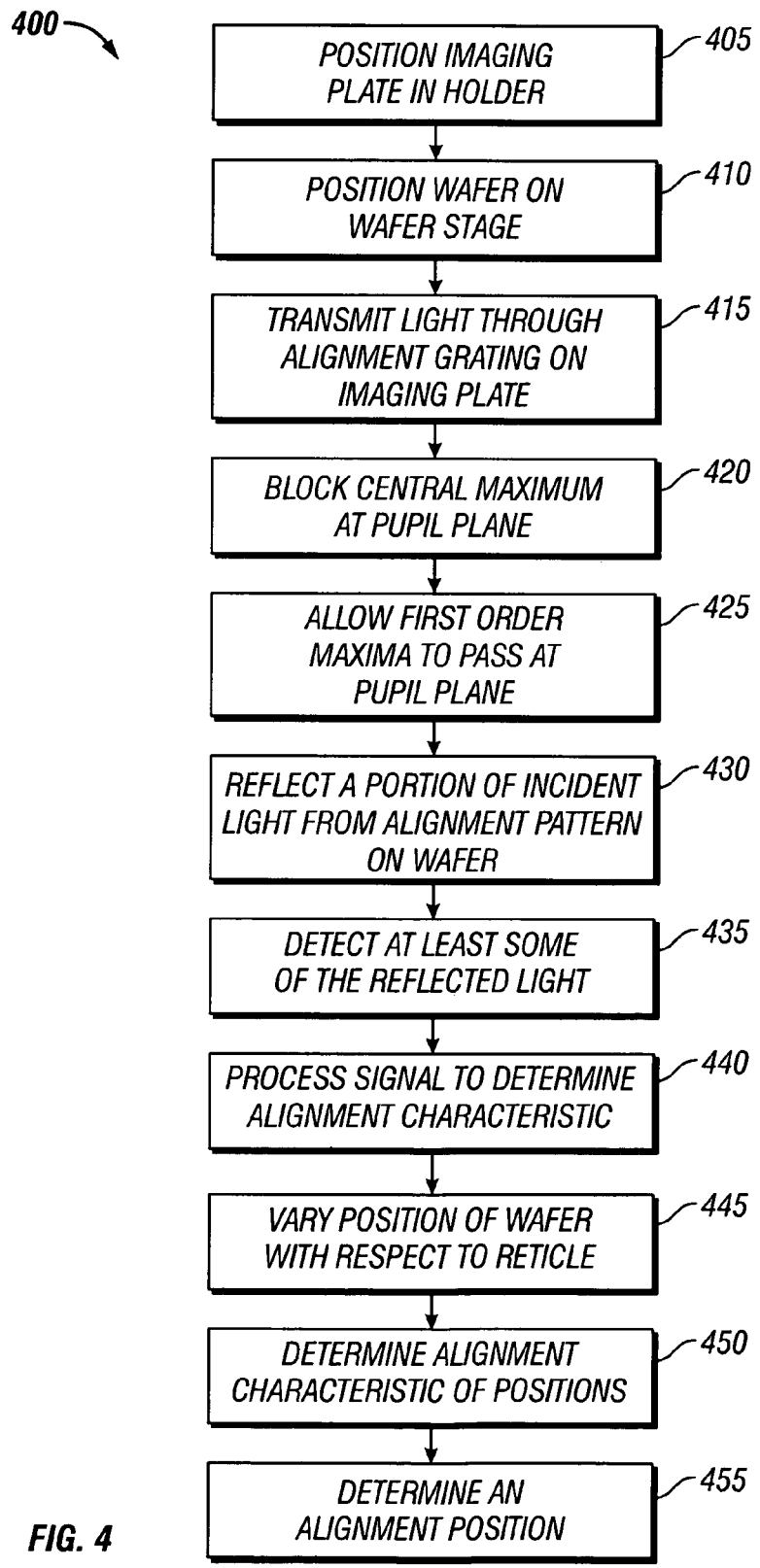
FIG. 4 shows a process for aligning an imaging plate with a wafer, according to an embodiment.

FIG. 4 shows a method 400 that may be used to align a wafer with a mask or reticle using a system such as system 200 of FIG. 2A. A reticle (or other imaging plate such as a mask) is positioned in a holder (405). A wafer is positioned on a wafer stage; for example, the wafer is positioned on a wafer holder of the wafer stage and is vacuum- or electrostatically-chucked to the holder (410).

The wafer may then be aligned with the reticle as follows. Light of an alignment wavelength is transmitted through an alignment grating on the reticle (or reflected by an alignment grating on the reticle), where the alignment grating has a pitch P (415). At the pupil plane, the light may be modified so that the intensity periodicity at the wafer is half that of the alignment grating. For example, a central maximum of the light may be blocked at the pupil plane (420), while the first order maxima may be allowed to pass (425).

A light intensity pattern with a periodicity equal to half that of the pitch of the alignment grating (i.e., P/2) is incident on the wafer, and a portion of the incident light is reflected from an alignment pattern on the wafer, where the alignment pattern has a periodicity equal to P/2 (430). At least some of the reflected light is detected (435), and a signal corresponding to a characteristic of the detected light may be processed to determine an alignment characteristic of the wafer at that position (440).

The position of the wafer stage (and the wafer) with respect to the reticle is varied (445). For different positions, the alignment characteristic of the wafer may be determined (450). An alignment position may be determined based on the alignment characteristics (455). For example, the alignment position may be the position at which the characteristic of the detected light is a maximum.

Figure 5:
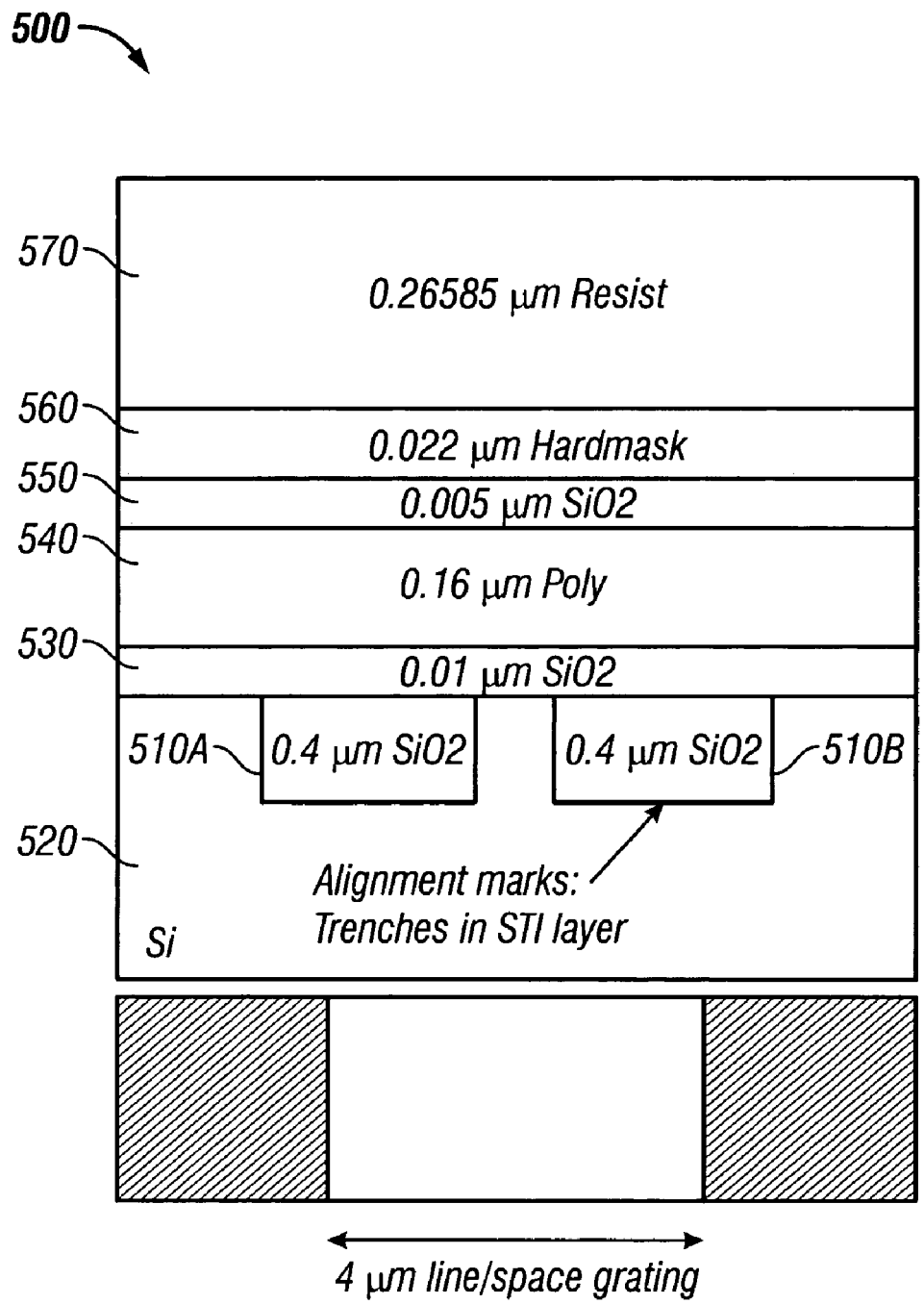
FIG. 5 shows a cross section of a region of a wafer including alignment features.

Prior to aligning the reticle and wafer according to a method such as that illustrated in FIG. 4, the alignment pattern (or patterns) are fabricated on the wafer. For example, the alignment patterns may be fabricated at the same time trenches for shallow trench isolation (STI) structures are formed. FIG. 5 shows a cross section of a region 500 of a wafer with an alignment pattern including alignment features 510A and 520A. Features 510A and 510B are formed by etching a trench in a silicon substrate 520, growing a thick SiO2 layer, and polishing the SiO2 layer back to the surface of substrate 520.

Prior to patterning additional features on the wafer, processes may be performed so that region 500 includes other layers. For example, region 500 may also include a $SiO_2$ layer 530, a polysilicon layer 540, a $SiO_2$ layer 550, a hardmask layer 560, and a resist layer 570.

A number of implementations have been described. Nevertheless, it will be understood that various modifications may be made without departing from the spirit and scope of the invention. For example, the alignment systems and techniques described herein may be used with different types of lithography systems. Accordingly, other implementations are within the scope of the following claims.

What is claimed is:

1. A method comprising:
   generating alignment light to align a wafer with an imaging plate of an optical system;
   modifying the alignment light using an alignment grating on the imaging plate, the alignment grating having a first pitch, wherein said modifying the alignment light using an alignment grating comprises reflecting light from the alignment grating; and
   further modifying the alignment light at a pupil plane of the optical system to have an intensity periodicity of less than the first pitch at a wafer plane.

2. The method of claim 1, wherein the intensity periodicity of the alignment light at the wafer plane is equal to half the first pitch.

3. The method of claim 1, wherein further modifying the alignment light at the pupil plane comprises:
   blocking a central maximum of the alignment light at the pupil plane; and
   allowing unblocked light including a first order maximum of the alignment light to pass at the pupil plane.

4. The method of claim 1, further comprising:
   generating patterning light to pattern one or more devices on the wafer;
   modifying the patterning light using a device pattern on the imaging plate; and
   exposing a portion of a resist layer on the wafer using the patterning light.

5. The method of claim 1, further comprising:
   reflecting a reflected portion of the alignment light from an alignment pattern on a wafer at the wafer plane, the alignment pattern having a second pitch less than the first pitch.

6. The method of claim 5, wherein the second pitch is half the first pitch.

7. The method of claim 5, further comprising:
   receiving at least a portion of the reflected portion of the light in a detector; and
   determining an alignment characteristic based on the receiving.

8. The method of claim 7, further comprising changing the position of the wafer based on the alignment characteristic.

9. The method of claim 7, further comprising determining an alignment position based on the alignment characteristic.

10. The method of claim 9, wherein changing the position of the wafer based on the alignment characteristic comprises positioning the wafer at the alignment position.

11. An apparatus comprising:
    means for generating alignment light to align a wafer with an imaging plate of an optical system;
    means for modifying the alignment light using an alignment grating on the imaging plate comprising means for reflecting light from the alignment grating, the alignment grating having a first pitch; and
    means for further modifying the alignment light at a pupil plane of the optical system to have an intensity periodicity of less than the first pitch at a wafer plane.

12. The apparatus of claim 11, wherein the intensity periodicity of the alignment light at the wafer plane is equal to half the first pitch.

13. The apparatus of claim 11, wherein said means for further modifying the alignment light at the pupil plane comprises:
    means for blocking a central maximum of the alignment light at the pupil plane; and
    means for allowing unblocked light including a first order maximum of the alignment light to pass at the pupil plane.

14. The apparatus of claim 11, further comprising:
    means for generating patterning light to pattern one or more devices on the wafer;
    means for modifying the patterning light using a device pattern on the imaging plate; and
    means for exposing a portion of a resist layer on the wafer using the patterning light.

15. The apparatus of claim 11, further comprising:
    means for reflecting a reflected portion of the alignment light from an alignment pattern on a wafer at the wafer plane, the alignment pattern having a second pitch less than the first pitch.

16. The apparatus of claim 15, wherein the second pitch is half the first pitch.

17. The apparatus of claim 15, further comprising:
    means for receiving at least a portion of the reflected portion of the light in a detector; and
    means for determining an alignment characteristic based on the receiving.

18. The apparatus of claim 17, further comprising means for changing the position of the wafer based on the alignment characteristic.

19. The apparatus of claim 17, further comprising means for determining an alignment an alignment position based on the alignment characteristic.

20. The apparatus of claim 18, wherein said means for changing the position of the wafer based on the alignment characteristic comprises means for positioning the wafer at the alignment position.

* * * * *